United States Patent [19]

Congdon

[11] Patent Number: 5,134,323

[45] Date of Patent: Jul. 28, 1992

[54] THREE TERMINAL NONINVERTING TRANSISTOR SWITCH

[76] Inventor: James E. Congdon, P.O. Box 617, Sudbury, Mass. 01776

[21] Appl. No.: 562,215

[22] Filed: Aug. 3, 1990

[51] Int. Cl.$^5$ .................... H03K 17/60; H03K 17/687
[52] U.S. Cl. .................................. 307/574; 307/570; 307/248; 307/254; 307/255; 307/446
[58] Field of Search .............. 307/250, 264, 270, 315, 307/446, 475, 570, 574, 253, 254, 255, 248

[56] References Cited

U.S. PATENT DOCUMENTS

| | | | |
|---|---|---|---|
| 3,767,942 | 10/1973 | Schwartz | 307/257 |
| 4,117,353 | 9/1978 | Butler et al. | 307/296.8 |
| 4,128,775 | 12/1978 | Frederiksen et al. | 307/315 |
| 4,224,535 | 9/1980 | Wilson et al. | 307/254 |
| 4,346,310 | 8/1982 | Carter | 307/475 |
| 4,375,600 | 3/1983 | Wu | 307/574 |
| 4,586,004 | 4/1986 | Valdez | 307/270 |
| 4,721,869 | 1/1988 | Okado | 307/270 |
| 4,728,817 | 5/1988 | Jessee et al. | 307/270 |
| 4,804,866 | 2/1989 | Akiyama | 307/570 |
| 4,839,537 | 6/1989 | Ueno | 307/570 |
| 4,845,386 | 7/1989 | Ueno | 307/570 |
| 4,922,129 | 5/1990 | Wright | 307/315 |
| 4,947,064 | 8/1990 | Kim et al. | 307/594 |
| 4,954,971 | 9/1990 | Wirth | 361/98 |
| 4,993,396 | 2/1991 | Miura | 307/570 |
| 4,999,518 | 3/1991 | Dhong et al. | 307/570 |
| 5,038,054 | 8/1991 | Lavigne et al. | 307/315 |
| 5,079,447 | 1/1992 | Lien et al. | 307/570 |

OTHER PUBLICATIONS

Sedra et al.; "MicroElectronic Circuits"; 1982; pp. 424, 425 and 855.

Primary Examiner—Stanley D. Miller
Assistant Examiner—Terry D. Cunningham
Attorney, Agent, or Firm—Kriegsman & Kriegsman

[57] ABSTRACT

A noninverting transistor switch having only three terminals includes in one embodiment first, second and third terminals, a depletion mode field effect transistor (FET) having drain and source electrodes that define a current path in the transistor and are connected to the third and second terminals respectively and a gate electrode for controlling the current flow in the transistor current path. A negative voltage converter having an input electrode, an output electrode and a return electrode has its output electrode coupled to the gate electrode in the FET its return electrode being coupled to the source electrode and its input electrode coupled to the first terminal. In operation, the current flow between the drain and source electrodes will be high when a low signal is applied to the input electrode with respect to the source electrode and will be lower when a higher signal is applied to the input electrode with respect to the source electrode.

10 Claims, 6 Drawing Sheets

| VTERM.13 | V21 OUTPUT | VTERM.17 |
|---|---|---|
| 0 V | 0 V | .2 V |
| 1 V | 0 V | .2 V |
| 2 V | -4 V | 9.9 V |
| 3 V | -6 V | 9.95 V |

FIG. 2

THREE TERMINAL NONINVERTING TRANSISTOR SWITCH

BACKGROUND OF THE INVENTION

The present invention relates generally to transistor switches and more particularly to noninverting transistor switches.

Noninverting transistor switches are well known in the art and widely used. In the past, such switches have contained at least four terminals, one terminal being used as an input, another terminal being used to connect the device to a load, another terminal being used for ground or return and the last terminal being connected to a power supply used to provide a "second" inversion.

Inverting three terminal transistor switches are also well known in the art.

In U.S. Pat. No. 4,266,100 to Hopper et al. there is disclosed a monolithically integrated semiconductor circuit, provided for coupling arrangements having symmetrical cross points, comprising two through switching NPN transistors, and a composite circuit for switching through the switching transistors. The composite circuit includes a double collector PNP transistor, with one collector connected to the base of a first NPN transistor and the other collector connected to the base of a second NPN transistor. The emitter of the double collector transistor is connected to the collector of both NPN transistors and also, via a first resistor to a voltage source. The base of the double collector transistor is connected, via a component causing a constant drop in voltage, to the voltage source, and also via a second resistor, to a trigger stage. The emitters of the NPN transistor are connected, respectively to the bases of the two through switching transistors.

In U.S. Pat. No. 4,307,298 to El Hamamsy et al. there is disclosed an optically toggled bilateral field effect transistor switch having a low leakage current is described. A high impedance path and, therefore, a low leakage current, is provided by a photovoltaically controlled field effect transistor.

In U.S. Pat. No. 4,390,790 to Rodriquez there is disclosed a solid state optically coupled power switch with light induced or modified voltage applied or removed at one or more MOSFET gate and source electrode pairs to shift each MOSFET between its high and low impedance states and in various circuit arrays for ac or dc switching and/or cross points switching or mechanical Form C relay substitution or other purposes.

In U.S. Pat. No. 4,410,809 to Puruichi et al. there is disclosed a disclosure related to a gate driving circuit for a depletion type, static induction transistor, including a capacitor coupled between the emitters of complementary-connected NPN and PNP transistors and the SIT gate, high value resistor parallel-connected to a series connection of a diode and a resistor between the SIT gate, and a negative gate voltage source.

In U.S. Pat. No. 4,849,683 to Flolid there is disclosed a lamp driver circuit for supplying and controlling power to a lamp from a power supply subject to voltage variations. A semiconductor switch is disposed in series with the lamp and a current sensing resistor. A capacitor integrates the lamp current during ON time of the switch and power supply voltage during OFF time. A voltage comparator with hysteresis responds to the capacitor voltage to control the conductive state of the switch. Above a nominal supply voltage, the driver circuit begins to pulse width modulate the power supplied to the lamp with a duty cycle inversely proportional to the square of the supply voltage to maintain constant power to the lamp. As the supply voltage rises above a second predetermined level, the driver circuit ceases to supply power.

Other known references of interest include the 1986 Linear Data Book by Linear Technology, pp. 2–170 and 2–171; Feb. 1990 QST pp. 24 through 27; the Feb. 1989 edition of PCIM pp. 22 through 27, and Blicher A., Field Effect and Bipolar Power transistor Physics, New York, Academic Press, 1981 Chapters 11 and 13.

It is an object of this invention to provide a new and improved transistor switch.

It is another object of this invention to provide a transistor switch that is noninverting.

It is still another object of this invention to provide a transistor switch that is noninverting and which contains only three terminals.

It is yet still another object of this invention to provide a noninverting transistor switch which does not include an additional power supply for obtaining a second inversion.

It is a further object of this invention to provide a three terminal transistor switch which is normally closed.

It is still a further object of this invention to provide a transistor switch which does not require a local or a wired-in power supply.

SUMMARY OF THE INVENTION

A noninverting transistor switch constructed according to the teachings of the present invention includes in one embodiment, first, second and third terminals, transistor means such as a depletion mode field effect transistor (FET) having drain and source electrodes that define a current path in the transistor and a gate electrode for controlling the current flow in the transistor current path and a negative voltage converter, the negative voltage converter having an input electrode coupled to the first terminal, an output electrode and a return electrode, the output electrode in the negative voltage converter being coupled to the gate electrode in the FET and the return electrode in the negative voltage converter being coupled to the second terminal along with the source electrode, whereby, the conductance between the third and second terminals will be high when a logic low signal is applied to the first terminal with respect to the second terminal and will be low when a logic HIGH signal is applied to the first terminal with respect to the second terminal. In another version of this embodiment the transistor means comprises a plurality of transistors.

In another embodiment of the invention the noninverting transistor switch includes first, second and third transistors, the first transistor having base, emitter, and collector electrodes, the base electrode being connected to the first terminal, the emitter electrode being connected to the second terminal, the collector being connected to the source of the second transistor and the base of the third transistor, the second transistor having gate, source and drain electrodes, the gate of which is connected to the second terminal, the drain of which is connected to the third terminal, and the source of which is connected to the collector of the first transistor and the base of the third transistor, the third transistor having base, emitter and collector electrodes, the base being connected to the source of the second transistor and the collector of the first transistor, the emitter being connected to the second terminal and the collector being connected to the third terminal and the drain of the second transistor. In a variation of this embodiment positive feedback is provided.

In another variation a resistor is substituted for the second transistor (an FET), one terminal of resistor for source and the other terminal of resistor for drain, with the gate electrode connection deleted. A number of other variations are also described.

Various features and advantages will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

FIG. 2 is a chart useful in understanding the operation of the switch shown in FIG. 1.

DETAILED DESCRIPTION OF PREFERRED EMBODIMENTS

Figure 1:
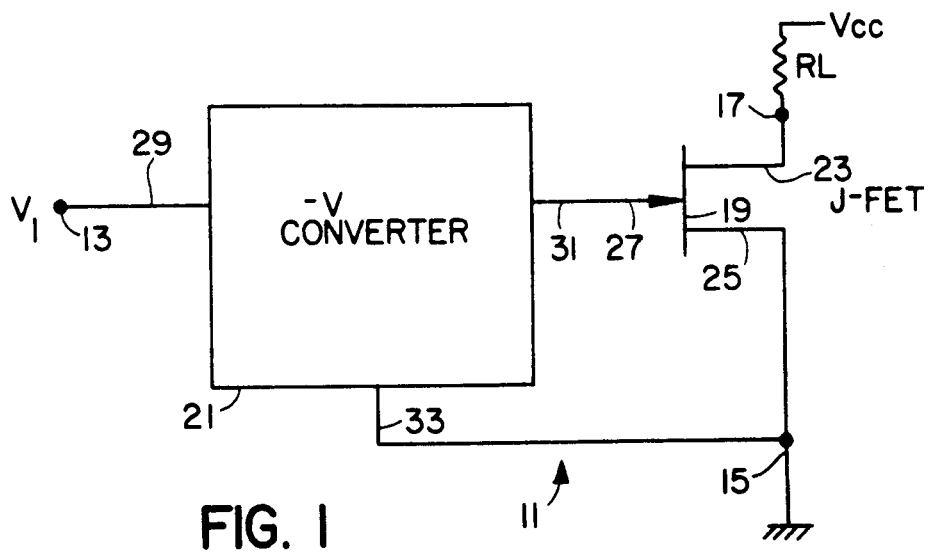
FIG. 1 is a schematic representation of one embodiment of the invention.

Referring now to the drawings there is shown in FIG. 1 an embodiment of a three terminal noninverting transistor switch constructed according to the teachings of the present invention and identified generally by reference numeral 11. The embodiment is referred to as the "input powered" embodiment in that the power used to obtain a "second" inversion is obtained from the input voltage.

Switch 11 includes a first terminal 13, a second terminal 15 and a third terminal 17. Switch 11 further includes a depletion mode FET 19 and a negative voltage converter 21.

Depletion mode FET 19 can be either a MOS or a J type. Negative voltage converter 21 may be constructed to be of nominally $-1\times$, $-2\times$, or greater magnitude than $-2\times$ (as taught by LT 1044/7660 "typical applications," page 8-27 of Linear Technology 1986 Databook). The magnitude of this negative voltage conversion is chosen according to the desired input logic-threshold voltage and the gate-threshold voltage of depletion-mode FET 19.

As is known, almost no DC current is required to drive the gate of a depletion-mode FET. Switching speed requirements and gate capacitance dictate the output current required from the negative voltage converter which can be a "switched-capacitor", "charge-pump", or other type negative voltage converter. Monolithic switched-capacitor CMOS converter cells—each similar to the 40 mA LT1044/7660, but with lower current capability, thus much smaller value (50 pF for instance) internal capacitors—can be integrated entirely on the same CMOS chip. These cells can be stacked and cascaded to generate many different magnitude voltage conversions. The cells for this low current application integrated negative voltage converter can occupy less die area than the LT1044/7660 by reducing pass or switch transistor size. Depletion mode FET 19 includes a drain electrode 23 which is connected to third terminal 17, a source electrode 25 which is connected to second terminal 15 and a gate electrode 27. Negative voltage converter 21 includes an input terminal 29 which is connected directly to first terminal 13 of switch 11, an output terminal 31 which is connected directly to gate electrode 27 and a return terminal 33 which is connected to second terminal 15.

As shown in FIG. 1, second terminal 15 may be connected to ground while third terminal 17 may be connected through a load resistor $R_L$ to a supply voltage Vcc; load resistor $R_L$ and supply Voltage Vcc not being a part of switch 11.

Switch 11 operates in the following manner. If the voltage applied at first terminal 13 is below the threshold value of negative voltage converter 21 then the voltage applied to gate electrode 27 will be zero volts causing high conductance between second terminal 15 and third terminal 17. On the other hand, if the voltage applied at first terminal 13 is above the threshold value of negative voltage converter 21 then the voltage applied to gate electrode will be a negative voltage causing low conductance between second terminal 15 and third terminal 17. If the particular negative voltage converter 21 used has a threshold value of about 1½ volts then a TTL logic LOW will be a voltage below the threshold and a TTL logic HIGH will be a voltage above the threshold.

A chart showing typical voltage values at first terminal 13 of switch 11, output terminal 31 of negative voltage converter 21 and third terminal 17 of switch 11 for a supply voltage $V_{cc}$ of 10 volts and a threshold value of 1.5 volts for negative voltage converter 21 is shown in FIG. 2. As can be seen, a voltage at first terminal 13 of one volt or less will result in a TTL logic LOW voltage at third terminal 17 while a voltage of 2 volts or greater will result in a TTL logic HIGH voltage at terminal 17.

Figure 3:
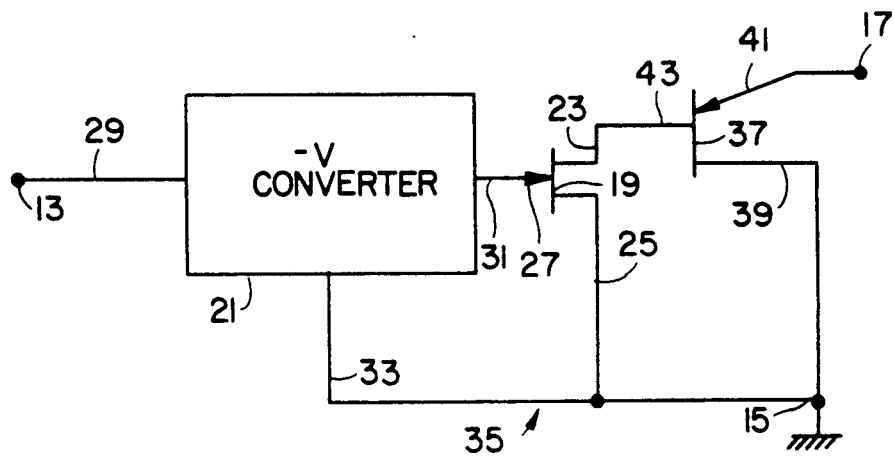
FIG. 3 is a schematic representation of a modification of the switch shown in FIG. 1.

Referring now to FIG. 3 there is shown a modification of the switch 11 shown in FIG. 1, the modification being identified by reference numeral 35.

Switch 35 includes first, second and third terminals labelled 13, 15 and 17, respectively, a depletion mode FET 19 and a negative voltage converter 21. The components are connected the same way as in switch 11 in FIG. 1 except that drain electrode 23 is not connected directly to third terminal 17 but rather is coupled to third terminal 17 through a bipolar transistor 37 which is also coupled to second terminal 15 and which serves as a current amplification device. Bipolar transistor 37 is arranged with its collector electrode 39 connected to second terminal 15, its emitter electrode 41 connected to third terminal 17 and its base electrode 43 connected directly to drain electrode 23 in FET 19.

Figure 4:
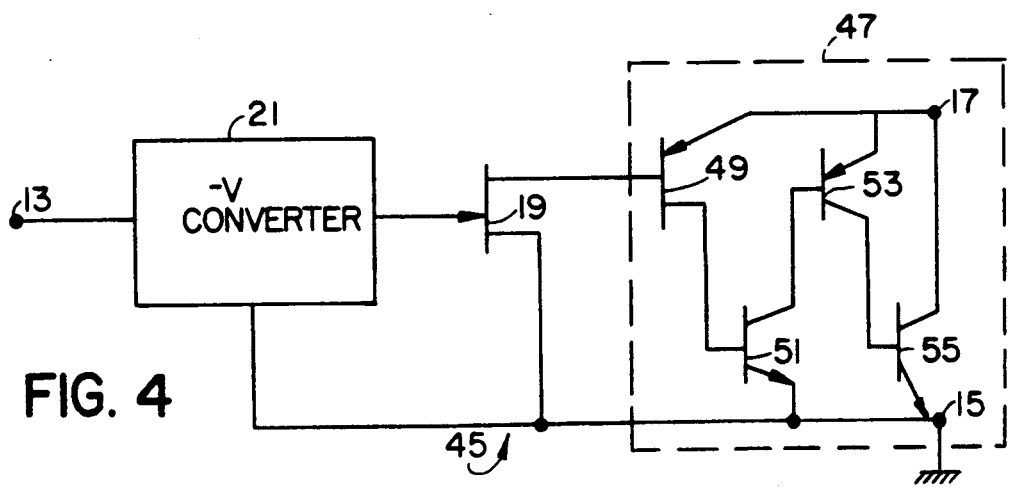
FIG. 4 is a schematic representation of another modification of the switch shown in FIG. 1.

Referring now to FIG. 4 there is shown a modification 45 of the switch shown in FIG. 3 wherein the current amplification means is in the form of an composite bipolar transistor (CBT) 47 rather than a single bipolar transistor. CBT 47 includes a plurality of transistors. For simplicity, only four transistors 49, 51, 53 and 55 are shown.

Figure 5:
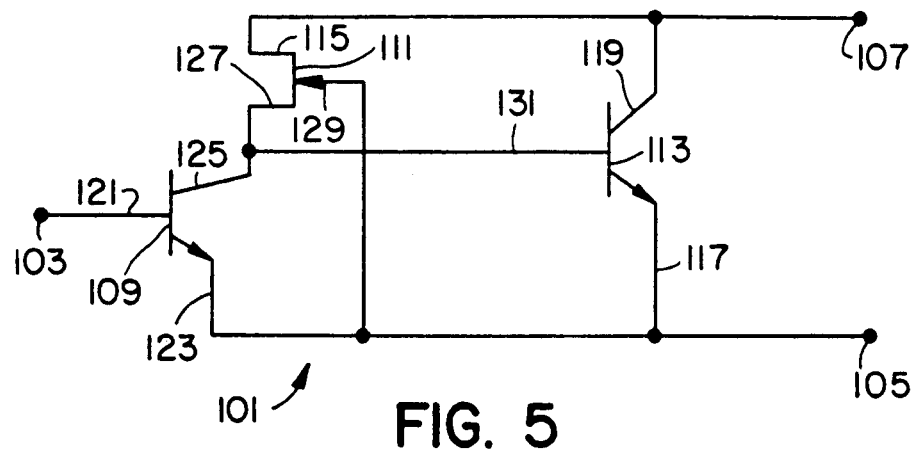
FIG. 5 is a schematic representation of another embodiment of the invention.

Referring now to the drawings there is shown in FIG. 5 another embodiment of a three terminal noninverting transistor switch constructed according to the teachings of the present invention and identified generally by reference numeral 101. This embodiment is referred to as the "output powered" embodiment in that the power needed to obtain a "second" inversion is obtained from the output (third terminal) voltage and current.

It should be noted that multiple embodiments of this invention can be included on one package, whether or not all are integrated monolithically. The scope of invention also includes 3-terminal noninverting transistor switches that use a "fourth" pin (power supply) for normal operation-and perhaps to enhance it, but still operate (for example as a "fail-safe" feature) without power applied to this power pin.

Switch 101 includes a first terminal 103, a second terminal 105 and a third terminal 107. Switch 101 further includes an input NPN transistor 109 an n-channel depletion-mode FET 111, and an output transistor 113. Input NPN transistor 109 can also be an enhancement mode MOS FET. FET 111 can be either a depletion-mode MOS or J-FET. Output NPN transistor 113 can be a bipolar, an enhancement mode MOS FET (or a compound device as shown in FIGS. 6, 7, 8, 10, 11 and 12).

Input terminal 103 connects to the base 121 of transistor 109. The emitter 123 of transistor 109 connects to second terminal 105. The collector 125 of transistor 109 connects to the source 127 of FET 111 and to the base 131 of transistor 113. The gate 129 of FET 111 connects to 105. The drain 115 of FET 111 connects to 107. The emitter 117 of transistor 113 connects to second terminal 105. The collector 119 of transistor 113 connects to third terminal 107.

Input signal voltage is applied to first terminal 103 and base 121 of transistor 109 which operates as an inverter. Zero volts or any voltage less than the turn-on threshold of transistor 109 will result in low conductance between its collector 125 and its emitter 123. FET 111 will conduct between its drain 115 and its source 127 current from source 127 will pass to base 131 of transistor 113 which will have high conductance between its collector 119 an its emitter 117. Thus high conductivity will exist between third terminal 107 and second terminal 105 for low voltage applied to first terminal 103.

Conversely, a voltage which is higher than the input threshold voltage of transistor 109 applied to first terminal 103 will result in high conductivity from collector 125 to emitter 123 of transistor 109. The current flowing from source 127 of FET 111 will thus be shunted to second terminal 105 via collector 125 and emitter 123 of transistor 109 resulting in a voltage less than the turn-on threshold voltage being applied to the base 131 of transistor 113. Conductivity between third terminal 107 and second terminal 105 will be low, the current entering third terminal 107 being essentially only the IDSS of FET 111.

Figure 6:
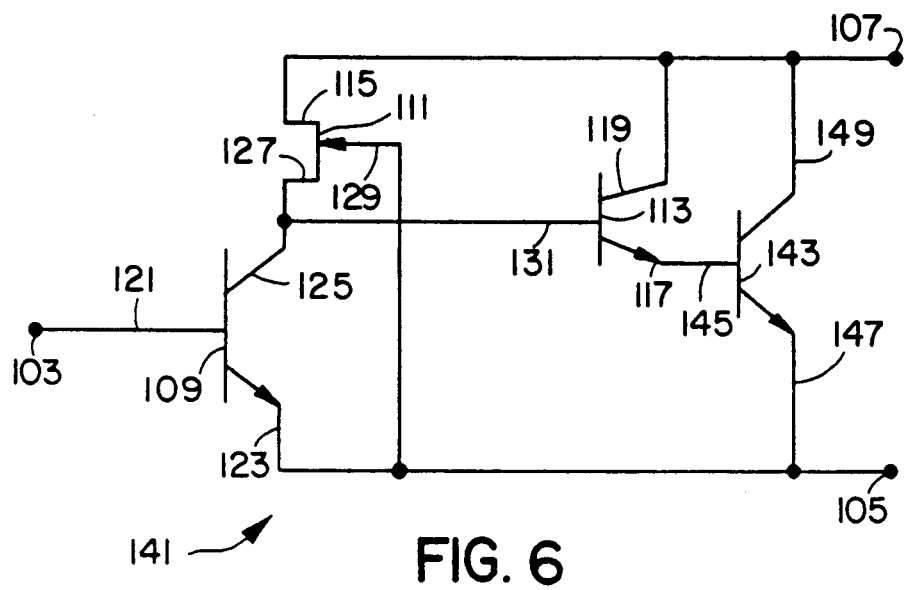
FIG. 6 is a schematic representation of a modification of the switch shown in FIG. 5.

Referring now to FIG. 6 there is shown a modification of the switch 101 shown in FIG. 5, the modification being identified by reference numeral 141.

Switch 141 includes first, second and third terminals labelled 103, 105 and 107 respectively, a transistor 109, a FET 111 and a transistor 113. The components are connected the same way as in switch 101 in FIG. 5 except that emitter electrode 117 of transistor 113 is not connected directly to second terminal 105 but rather is coupled to second terminal 105 through NPN transistor 143 which is also coupled to second terminal 105 and which serves as a current amplification device. Transistor 143 is arranged with its collector 149 connected to third terminal 107, its emitter 147 connected to second terminal 105, and its base electrode 145 connected directly to emitter electrode 117 in transistor 113. The Darlington-coupled arrangement of transistors 113 and 143 provides higher output current capability for a given IDSS in FET 111 compared to the arrangement in FIG. 5.

Figure 7:
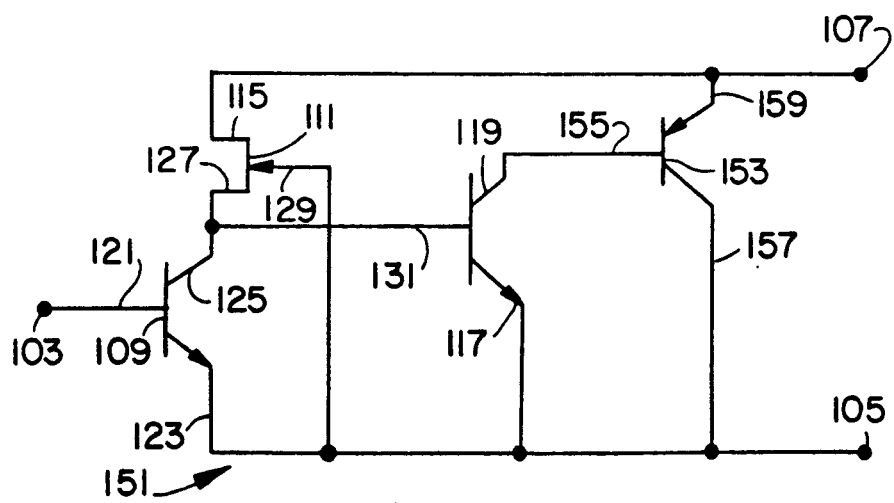
FIG. 7 is a schematic representation of another modification of the switch shown in FIG. 5.

Referring now to FIG. 7 there is shown a modification of the switch 101 shown in FIG. 5 the modification being identified by reference numeral 151.

Switch 151 includes first, second and third terminals labelled 103, 105 and 107 respectively, an NPN transistor 109, an n-channel FET 111 and an NPN transistor 113. The components are connected the same way as switch 101 in FIG. 5 except that collector 119 of NPN transistor 113 is not connected directly to third terminal 107 but rather is coupled to third terminal 107 through PNP transistor 153 which is also connected to third terminal 107 and which serves as a current amplification device. PNP transistor 153 is arranged with its collector 157 connected to second terminal 105, its emitter 159 connected to third terminal 107. In FIG. 7 a "composite" transistor connection of NPN transistor 113 and PNP transistor 153 provides higher current amplification than the circuit in FIG. 5 and also with lower on voltage than the circuit in FIG. 6.

Figure 8:
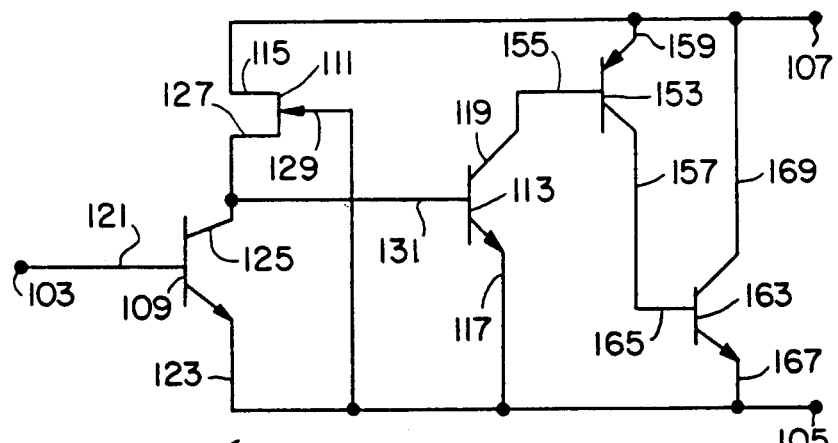
FIG. 8 is a schematic representation of another modification of the switch shown in FIG. 5.

Referring to FIG. 8 there is shown a modification of the switch 101 shown in FIG. 5, the modification being identified by reference numeral 161.

Switch 161 includes first, second and third terminals labelled 103, 105 and 107 respectively, an NPN transistor 109, an n-channel FET 111 and an composite bipolar transistor CBT comprised of NPN transistor 113, PNP transistor 153, NPN transistor 163 and possible further transistors of alternating polarity connected similarly. The components are connected the same way as switch 101 in FIG. 5 except that collector 119 of NPN transistor 113 is not connected directly to third terminal 107 but rather is coupled to third terminal 107 through PNP transistor 153 which is also connected to third terminal 107 and which serves as a current amplifying device. PNP transistor 153 is arranged with its collector 157 connected to base 165 of NPN transistor 163. The emitter 159 of PNP transistor 153 is connected to third terminal 107. The emitter 167 of NPN transistor 163 is connected to second terminal 105, the collector of NPN transistor 163 is connected either to third terminal 107 or to base of a further PNP transistor in a manner similar and iterative of the way collector 119 of NPN transistor 113 is connected to base 155 of PNP transistor 153. The final transistor of the iterative chain has its collector connected to third terminal 107 if it is an NPN, or its collector connected to second terminal 105 if the last transistor is a PNP.

Figure 9:
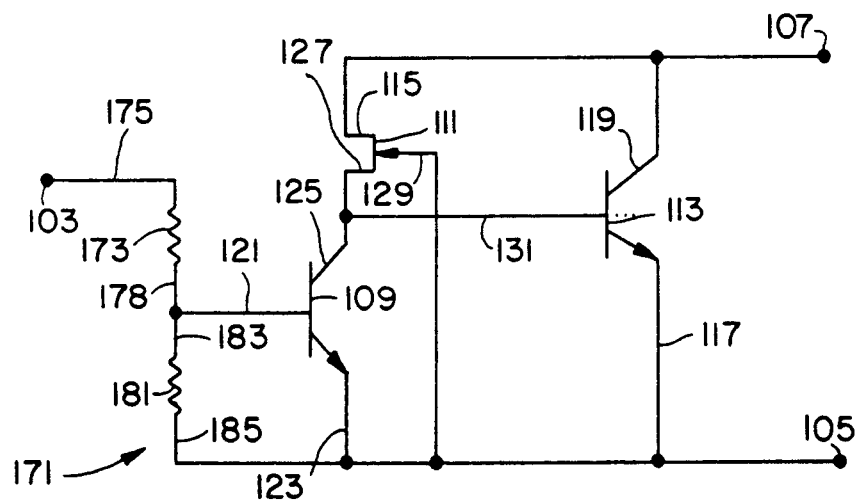
FIG. 9 is a schematic representation of another modification of the switch shown in FIG. 5.

Referring now to FIG. 9 there is shown a modification of the switch 101 shown in FIG. 5, the modification being identified by reference numeral 171.

Switch 171 includes first second and third terminals labelled 103, 105 and 107 respectively, an NPN transistor 109, an n-channel FET 111, and an NPN transistor 113. The components are connected the same way as switch 101 in FIG. 5 except that base 121 of transistor 109 is not connected directly to first terminal 103 but rather is coupled to both terminal 178 of resistor 173 and to terminal 183 of resistor 181, terminal 185 of resistor 181 is connected to second terminal 105. Terminal 175 of resistor 173 is connected to first terminal 103. Resistors 173 and 181 are thus connected as a voltage divider reducing the voltage level of first terminal 103 and applying this divided voltage to base 121 of transistor 109 thereby adjusting the input voltage threshold at first terminal 103.

Figure 10:
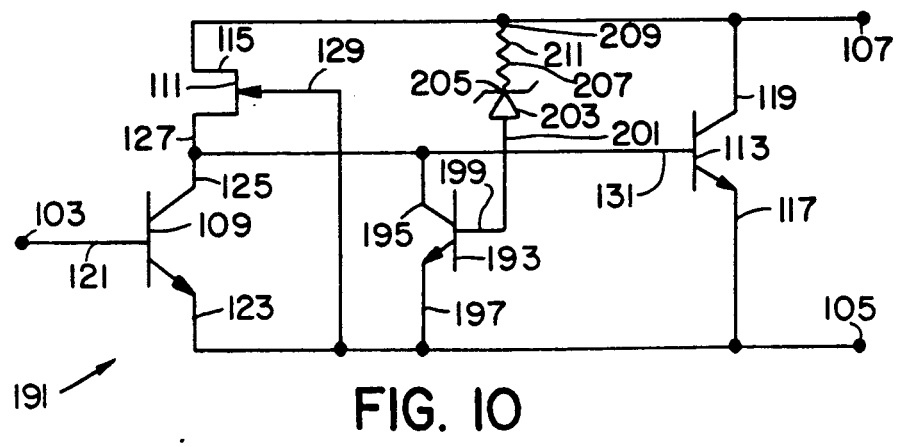
FIG. 10 is a schematic representation of another modification of the switch shown in FIG. 5.

Referring now to FIG. 10 there is shown a modification of the switch 101 shown in FIG. 5 the modification being identified by reference numeral 191. Switch 191 includes first, second and third terminals labelled 103, 105 and 107 respectively, an NPN transistor 109, an n-channel FET 111, and an NPN transistor 113. The components are connected the same way as switch 101 in FIG. 5. NPN transistor 193 zener diode 203 and resistor 211 have been added to provide over-voltage protection. The emitter of transistor 193 is connected to second terminal 105, its collector is connected to collector 125 of transistor 109, source 127 of FET 111, and base 131 of transistor 113. The base of transistor 193 is connected to the P-type semiconductor electrode 201 of zener diode 203, whose N-type semiconductor electrode is connected to terminal 207 of resistor 211, whose other terminal 209 is connected to third terminal 107. Resistor 211 is required to prevent excessive current flowing in zener diode 203 and NPN transistor 193 during application of over-voltage to third terminal 107.

Figure 11:
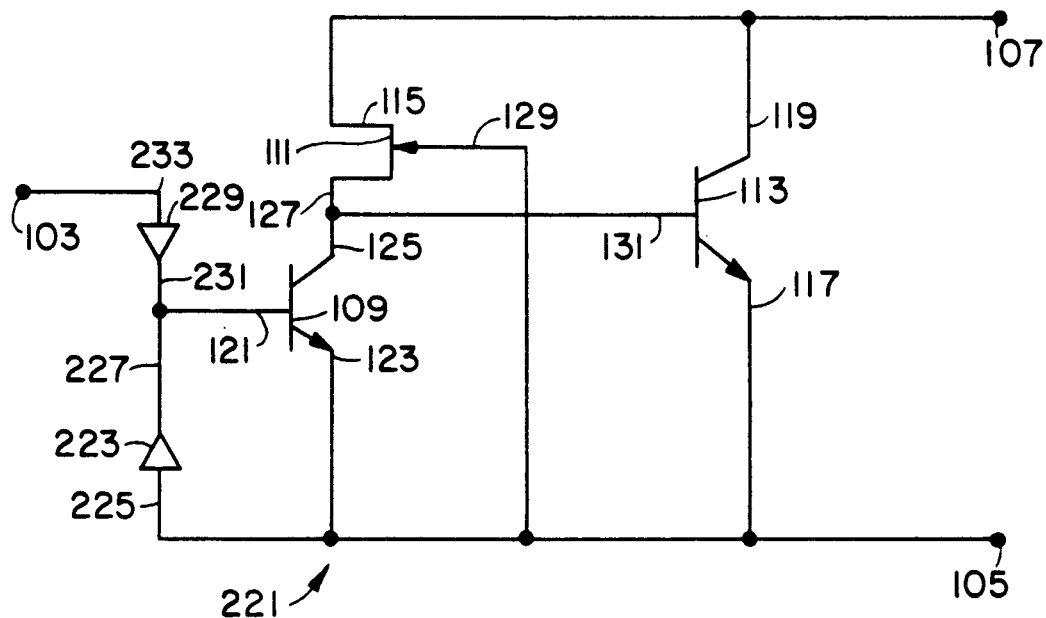
FIG. 11 is a schematic representation of another modification of the switch shown in FIG. 5.

Referring now to FIG. 11 there is shown a modification of the switch 101 shown in FIG. 5. The modification being identified by reference numeral 221. Switch 221 includes first, second and third terminals labelled 103, 105 and 107 respectively, an NPN transistor 109, and n-channel FET 111, and an n-channel FET 111, and an NPN transistor 113. The components are connected the same way as switch 101 in FIG. 5 except that base 121 of transistor 109 is not connected directly to first terminal 103 but rather is connected to both cathodes 231 and 227 of diodes 229 and 223 respectively. The anode 225 of diode 223 is connected to second terminal 105 and the anode 233 of diode 229 is connected to first terminal 103. Adding diodes 229 and 223 prevent erroneous response to opposite polarity voltage signals at first terminal 103, furthermore diode 229 adds to the input threshold voltage which may also be desirable.

Figure 12:
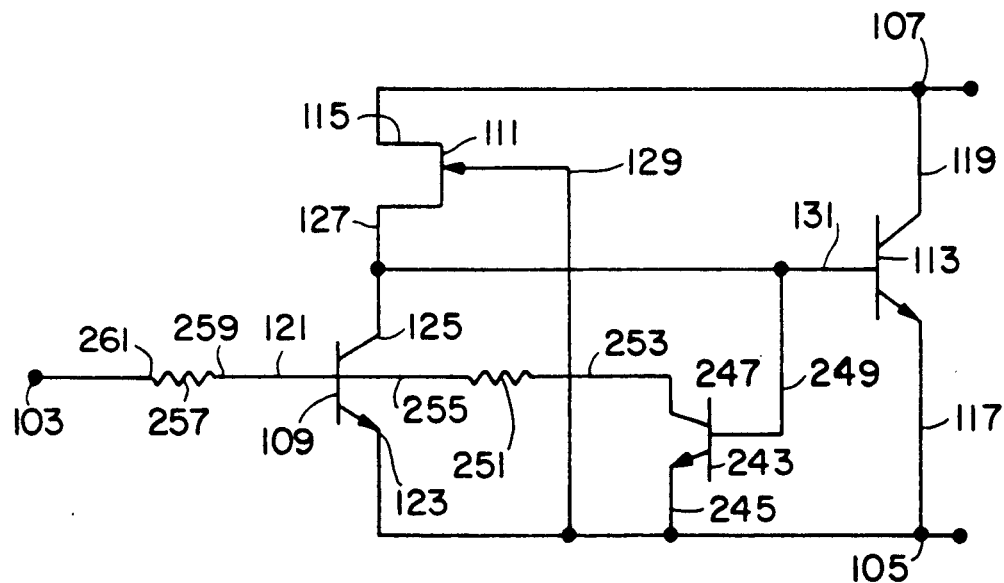
FIG. 12 is a schematic representation of another modification of the switch shown in FIG. 5.

Referring now to FIG. 12 there is shown a modification of the switch 101 shown in FIG. 5, the modification being identified by reference numeral 241.

Switch 241 includes first second and third terminals 103, 105 and 107 respectively, and NPN transistor 109, an n-channel FET 111, and an NPN transistor 113. The components are connected the same way as switch 101 in FIG. 5 except that base 121 of transistor 109 is not directly connected to first terminal 103, but rather is connected to first terminal 103 through resistor 257 which is also connected to first terminal 103. First terminal 103 is connected to terminal 261 of resistor 257, terminal 259 of resistor 257 is connected to base 121 of transistor 109 and also to terminal 255 of resistor 251, the other terminal 253 of which is connected to collector 247 of NPN transistor 243, its emitter 245 is connected to second terminal 105 and its base 249 is connected to base 131 of transistor 113 and to source 127 of FET 111 and to collector 125 of transistor 109. Transistor 243 and resistors 257 and 251 operate so as to introduce a controlled amount of positive feedback which results in hysteresis or "Schmitt-trigger" like variation of the first terminal 103 input threshold voltage.

Figure 13:
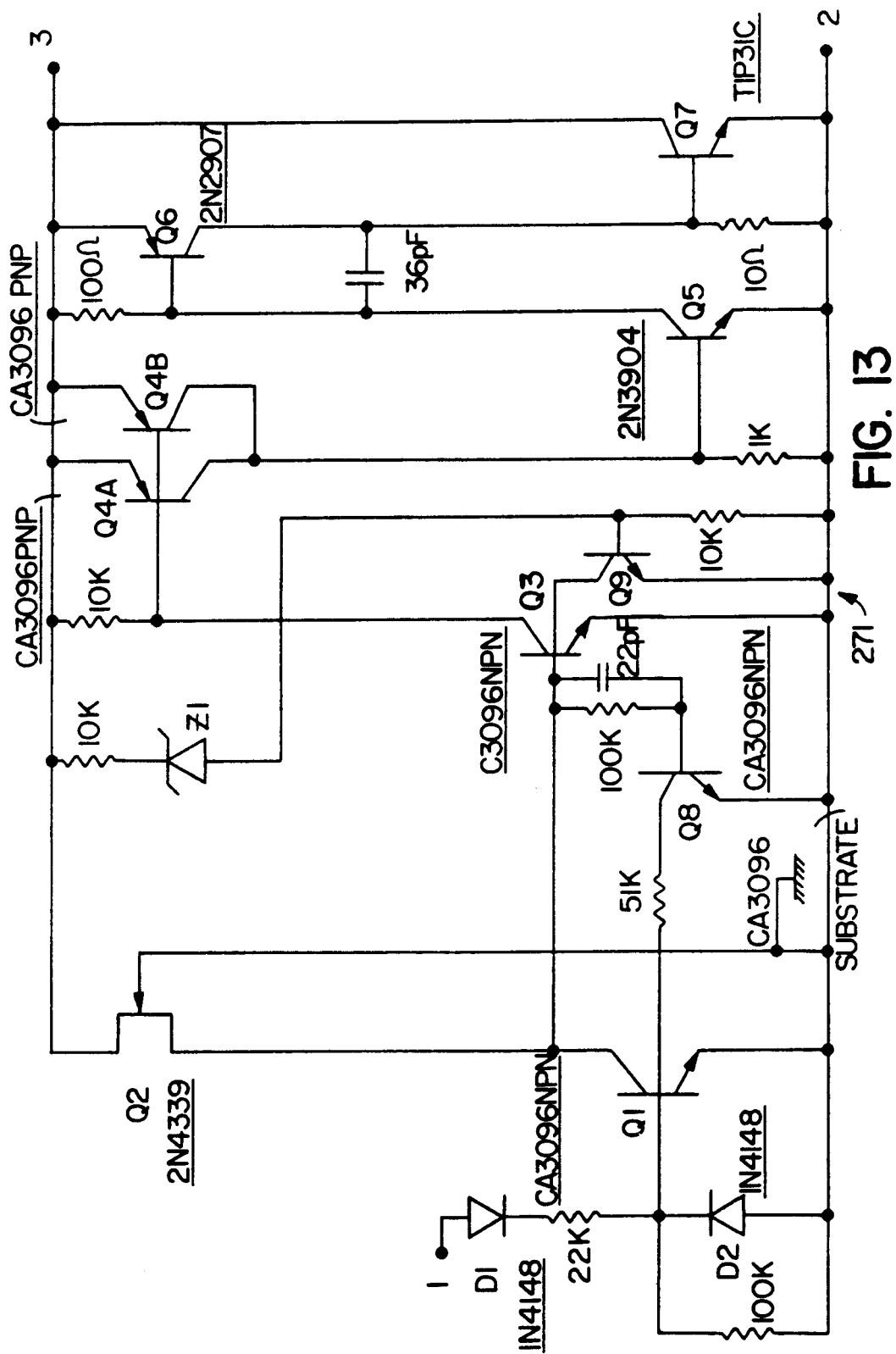
FIG. 13 is a schematic representation of an embodiment of the invention which was actually constructed and tested.

Referring now to FIG. 13 there is shown a schematic representation of an output-powered embodiment of the invention that was actually built using commerically available electronic components and then tested, the embodiment being identified by reference numeral 271. System 271 is capable of switching a three ampere load on or off in five microseconds from the input logic transition at input terminal 1. The positive-going input threshold is about +1.5 volts and the negative-going input theshold is about +1.2 volts. As can be appreciated, system 271 is a modification of the embodiment shown in FIG. 8. As can be seen, transistors Q3, Q4A, Q4B, Q5, Q6 and Q7 are connected as an composite bipolar transistor, with each one of these transistors having a base-to-emitter resistor to improve switching speed. System 271 can be manufactured in discrete or hybrid form. System 271 can be manufactured as a monolithic IC by substituting similar integrated devices. Q6 can be a large lateral PNP for the IC version. The other substitutions are apparent to one skilled in bipolar IC design.

It should be noted that in system 271 D1 sets the threshold ànd blocks negative inputs, D2 shunts negative inputs, Q1 is an input inverter transistor, Q2 simulates an EP1 FET, Q3 serves as an output inverter and first Q in the CBT, Q4A and Q4B serve as the second Q in the CBT, Q5 serves as the third Q in the CBT and the predriver, Q6 serves as the fourth Q in the CBT and the driver, Q7 serves as the fifth Q in the CBT and the output and Q8 serves as a positive feedback or Schmitt trigger switch. It should also be noted that CA3096 is an array of IC-type transistor i.e. 3NPN's and 2PNP's.

The embodiments of the present invention is intended to be merely exemplary and those skilled in the art shall be able to make numerous variations and modifications to it without departing from the spirit of the present invention. For example PNP and p-channel transistors can be substituted for NPN and n-channel transistors and vice versa; the resulting embodiment will behave as described with negative power supply voltage applied to the load and with negative-logic input levels. The invention will also be of use where enhancement mode FETs are substituted for bipolar transistors (gate for base, source for emitter, and drain for collector), especially for NPN transistor 109, furthermore, Schottky clamping can be added to bipolar transistors to reduce turn-off time. All such variations and modifications are intended to be within the scope of the present invention as defined in the appended claims.

What is claimed is:

1. A noninverting transistor switch comprising a circuit having only three terminals, said three terminals being a first terminal, a second terminal and a third terminal, said circuit including:
   a. a depletion mode field effect transistor (FET), the FET having drain and source electrodes that define a current path in the transistor and a gate electrode for controlling the current flow in the transistor current path, the drain and source electrodes of said FET being connected to said third and second terminals, respectively, the switching for the noninverting transistor switch taking place between the third and second terminals, and
   b. a negative voltage converter, the negative voltage converter having an input electrode, an output electrode and a return electrode, the input electrode being coupled to said first terminal, the output electrode being coupled to the gate electrode of the FET and the return electrode being coupled to the source electrode of the FET and to said second terminal, said negative voltage converter providing a voltage at the output electrode that is opposite in polarity with respect to a voltage received at the input electrode in reference to said return electrode,
   c. whereby, the conductance between the third terminal and said second terminal will be high when a low voltage is applied to the first terminal with respect to the second terminal and will be lower when a higher voltage signal is applied to the first terminal with respect to the second terminal.

2. The noninverting transistor switch of claim 1 and further including current amplifying means coupled to the drain and source electrodes of said FET and said third terminal, coupling said drain electrode to said third terminal.

3. The noninverting transistor switch of claim 2 and wherein the current amplifying means coupled to the FET comprises a Darlington coupled bipolar transistor.

4. The noninverting transistor switch of claim 2 and wherein the current amplifying means coupled to the FET comprises a composite bipolar transistor (CBT).

5. The noninverting transistor switch of claim 2 and wherein said current amplifying means comprises:
   a. a bipolar transistor having a base electrode, an emitter electrode and a collector electrode, the collector electrode being coupled to the second terminal of the noninverting transistor switch, the emitter of said bipolar transistor being coupled to the third terminal of the noninverting transistor switch, and the drain electrode of the FET being coupled to the base electrode of said bipolar transistor,
   b. whereby the bipolar transistor will receive at least some of the current entering the third terminal of the noninverting transistor switch, thus increasing the current carrying capacity beyond Idss of the FET.

6. The noninverting transistor switch of claim 2 and wherein the current amplifying means coupled to the FET comprises a bipolar transistor.

7. A noninverting transistor switch comprising a circuit having only three terminals, said terminals being identified as a first terminal, a second terminal and a third terminal, said circuit including:
   a. first, second and third transistor,
   b. the first transistor having base, emitter and collector electrodes, the base electrode being coupled to said first terminal,
   c. the second transistor having drain, gate and source electrodes, the drain electrode being coupled to said third terminal,
   d. The third transistor having base, emitter and collector electrodes, the emitter electrode being connected to said second terminal and the collector electrode being connected to said third terminal,
   e. the collector electrode of the first transistor being coupled to the source electrode of the second transistor and the base electrode of the third transistor, and
   f. the gate electrode of the second transistor and the emitter electrode of the third transistor being coupled to the emitter electrode of the first transistor, the switching for the noninverting transistor switch taking place between the collector electrode and emitter electrode of the third transistor, said collector and emitter electrodes being coupled respectively to said third terminal and said second terminal of the noninverting transistor switch.

8. A noninverting transistor switch according to claim 7 wherein the third transistor is a composite bipolar transistor.

9. A noninverting transistor switch according to claim 7 wherein over-voltage protection is provided by circuitry including:
   a. a fourth transistor having a base electrode, an emitter electrode and a collector electrode, said transistor being used to shunt base drive current away from the third transistor during over voltage conditions,
   b. a zener diode having a first electrode and a second electrode,
   c. a first resistor having a first electrode and a second electrode and which limits zener current during over-voltage conditions,
   d. the collector electrode of the fourth transistor being coupled to the base electrode of the third transistor,
   e. the emitter electrode of the fourth transistor being coupled to the second terminal of the noninverting transistor switch,
   f. the first electrode of the zener diode being coupled to the third terminal of the noninverting transistor switch,
   g. the second electrode of the zener diode being connected to the first electrode of the first resistor, and
   h. the second electrode of the first resistor being coupled to the base of the fourth transistor,
   i. whereby when the noninverting transistor switch is initially turned off and a voltage significantly higher than the zener breakdown is maintained on terminal three with respect to terminal two, the switch cannot subsequently be turned on and will thus be spared from possibly destructive turn-on stresses.

10. A noninverting transistor switch according to claim 7 wherein the third transistor is coupled through circuitry to the first terminal of the noninverting transistor switch to provide hysteresis, said circuitry including:

a. a fourth transistor having a base electrode, an emitter electrode and a collector electrode,
b. a first resistor having a first electrode and a second electrode,
c. a second resistor coupling the base electrode of the first transistor to the first terminal, having a first electrode and a second electrode, the ratio of the first and second resistors sets the amount of hysteresis at the first terminal,
d. the emitter electrode of the fourth transistor being coupled to the second terminal of the noninverting transistor switch,
e. the base electrode of the fourth transistor being coupled to the base electrode of the third transistor,
f. the first electrode of the first resistor being coupled to the collector of the fourth transistor,
g. the second electrode of the first resistor being coupled to the base electrode of the first transistor,
h. the base electrode of the first transistor being coupled to the second electrode of the second resistor and
i. the first electrode of the second resistor being coupled to the first terminal of the noninverting transistor switch,
j. whereby, when the noninverting transistor switch is initially in the on state a higher voltage must be applied to the first terminal to turn it off than would have been required without the fifth transistor and the second resistor.

* * * * *